(12) United States Patent
Monaco et al.

(10) Patent No.: US 8,097,868 B2
(45) Date of Patent: Jan. 17, 2012

(54) GALVANIC OPTOCOUPLER AND METHOD OF MAKING

(75) Inventors: Mariantonietta Monaco, Riccia (IT); Massimiliano Fiorito, S. Agata Li Battiati (IT); Gianpiero Montalbano, Tremestieri Etneo (IT); Salvatore Coffa, Tremestieri Etneo (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 918 days.

(21) Appl. No.: 12/019,186

(22) Filed: Jan. 24, 2008

(65) Prior Publication Data
US 2008/0173879 A1  Jul. 24, 2008

(30) Foreign Application Priority Data
Jan. 24, 2007  (IT) .................................. MI07A0101

(51) Int. Cl.
*H01L 33/00* (2010.01)
(52) U.S. Cl. .......................................... 250/551; 257/80
(58) Field of Classification Search .................. 250/551, 250/208.1, 214.1, 214 R, 370.14; 257/80–82
See application file for complete search history.

(56) References Cited

U.S. PATENT DOCUMENTS

| 4,857,746 | A  | * | 8/1989 | Kuhlmann et al. | 250/551 |
| 6,157,035 | A  | * | 12/2000 | Kuijk et al. | 250/370.14 |
| 6,371,591 | B1 | * | 4/2002 | Conta et al. | 347/19 |
| 7,626,207 | B2 | * | 12/2009 | Vogel et al. | 257/82 |

FOREIGN PATENT DOCUMENTS
EP  1132975  9/2001

* cited by examiner

*Primary Examiner* — Seung C Sohn
(74) *Attorney, Agent, or Firm* — Lisa K. Jorgenson; E. Russell Tarleton; Seed IP Law Group PLLC

(57) ABSTRACT

A galvanic optocoupler of the type monolithically integrated on a silicon substrate and having at least one luminous source and a photodetector interfaced by means of a galvanic insulation layer. The photodetector can be a phototransistor realized in the silicon substrate, and the galvanic insulation layer (40) is a passivation layer of this phototransistor. The luminous source, above the galvanic insulation layer includes an integrated LED having a first and second polysilicon layer with function of cathode and anode, respectively, these first and second layers enclosing at least one light emitter layer, in particular a silicon oxide layer enriched with silicon (SRO). An integration process of a galvanic optocoupler thus made, in particular in BCD3s technology is provided.

24 Claims, 4 Drawing Sheets

GALVANIC OPTOCOUPLER AND METHOD OF MAKING

BACKGROUND

1. Technical Field

The present disclosure relates to a galvanic optocoupler of the type monolithically integrated on a silicon substrate and, more particularly, to a galvanic optocoupler of the type having at least one luminous source and a photodetector interfaced by means of a galvanic insulation layer, as well as to an integration process of forming such a galvanic optocoupler.

2. Description of the Related Art

As is well known, a galvanic optocoupler is essentially a safety device that allows two different sections of a system to exchange commands and information in a bidirectional way while remaining separate from the electric viewpoint. In particular, the signal transmission through the galvanic optocoupler occurs through luminous pulses that pass through an insulating layer transparent to the light but with high dielectric rigidity.

Thus, there occurs an optical coupling between the two parts of the system connected by the galvanic optocoupler that however, remain electrically insulated from each other (in particular, they do not have ground terminals in common).

A galvanic optocoupler of the known type is schematically shown in FIG. 1, globally indicated with reference numeral 1. In particular, the galvanic optocoupler 1 connects a first circuit node, or input IN, to a second circuit node, or output OUT, ensuring the galvanic insulation of the respective voltage references GND1 and GND2 due to the conversion of an input electric signal into an optical signal.

The galvanic optocoupler 1 then constitutes an input stage, in particular an optical source 2 connected, through an intermediate stage 3 realized by a transmission means, in particular an insulation layer, to an output stage or optical detector 4. In particular the insulation layer of the intermediate stage 3 is a transparent means suitable for transmitting an optical signal (indicated with "Light" in FIG. 1).

More in particular, the input optical source 2 or transmitter emits a power that is transferred to the optical detector 4 or output photodetector. In this way, if the means of transmission through which the transmitter and photodetector communicate shows optimal transparency and optimal electric insulation, the galvanic optocoupler 1 fully realizes the desired transmission functionality and simultaneous insulation.

The field of application of greatest interest is that relating to the insulation between electronic circuits where, for example, the interaction of a low power intelligent circuit, i.e., constituting a memory (SMART) and having calculation capacity, with a high power circuit with the respective grounds insulated from each other is provided, as schematically shown in FIG. 2.

In particular, an electronic system 5 includes a low power circuit 6 and a high power circuit 7 inserted, in series with each other, between an input terminal INPUT and an output terminal OUTPUT. The low voltage circuit 6 has in turn an input stage or driver 8 connected through a galvanic optocoupler 1 to an output stage 9.

Such a type of connection between low and high power circuits 6 respectively 7 eliminates interference and signal disturbance due to potential differences between different grounds that generate noise in the transmission of a signal inside the electronic system 5 and the conduction paths to ground, or ground-loops.

The transmission of the signals through optical via also allows an extremely linear response besides a high band width in the total absence of distortion.

It is also suitable to underline that the galvanic insulation constitutes an indispensable requisite in several applications, such as for example those in the biomedical sector, where it is necessary to preserve the subject of the measurement (living organism) from possible electric shocks (for example through a catheter a current of a few tens of μA is enough to induce cardiac fibrillation in the subject).

Galvanic optocouplers are thus devices widely commercially available. They are usually realized by assembling in a suitable way a light emission diode (LED), in particular realized with direct gap semiconductors, such as semiconductors of the III-V type, as an optical source, and a photodetector (usually a photodiode or a phototransistor), typically realized in Silicon, as a detector or an optical detector.

The use of these optical transmission systems has brought into development a new concept of communications according to which information is conveyed by suitable light pulses [optical transmission] in a more efficient way with respect to traditional electronic transmission, which can be essentially referred to as the transfer of electric currents.

The optical transmission of information offers, in fact, a considerable number of advantages with respect to electronic transmission. Suffice it to think of the greatest passing band having immunity to electromagnetic disturbance and to the resulting very high data transfer capacity and speed. This has given extraordinary impulse to the use of photonics, which is the technology of systems or devices that emit, modulate, transmit, or detect light. As in electronics where the electrons are the actors, in photonics the photons (light quantum) are the protagonists.

It is also suitable to emphasize that photonics, at present, is based on semiconductors that are different from silicon, which has found and finds wide use in the field of the electronics. In fact, it is known that crystalline silicon is an indirect gap material and thus does not emit light at ambient temperature in an efficient way, differently from other semiconductor materials such as III-V semiconductors (for example gallium arsenide, GaAs) which show instead a direct gap and a high emission efficiency.

These semiconductor materials alternative to silicon have however a complex and quite expensive treating technology, far from that of the silicon semiconductor widely used for the realization of electronic devices for the processing and the storage of information, such as microprocessors and memories, by virtue of its excellent electrical and mechanical properties and of its mature and now consolidated manufacturing technology, which is extremely developed and characterized by the use of reliable, low cost processes and materials.

A comparison of the technologies based on different semiconductor materials is summarized in the following Table 1, in terms of costs per $mm^2$:

TABLE 1

| Material | $mm^2$ cost |
| --- | --- |
| Si (CMOS technology) | 0.01$ |
| SiGe (epitaxy) | 0.60$ |
| GaAs (epitaxy) | 1.00$ |
| InP (epitaxy) | 10.00$ |

From this comparison it is thus immediately evident that for realizing a simple and functional interface with the microelectronics technology, the use of silicon is logical, which, in terms of costs, is thus the ideal material for developing also optoelectronic devices. The use of silicon would allow in this way the integration of electric functions with optical functions in a single substrate.

The enormous technological interest for light emission and transmission using silicon has led, in recent years, to the identification of some promising strategies for the realization of systems and of discrete light emitter devices, completely based on silicon.

A first known solution for meeting this need and obtaining an efficient light emission from the silicon is that of modifying its band structure, synthesizing silicon nanocrystals in a matrix of silicon oxide ($SiO_2$), as schematically shown in FIGS. 3A-3C.

In particular, FIG. 3A schematically shows a luminous source or Light Emitting Diode (LED) 10 realized by means of the deposition on a silicon substrate 11 of a silicon oxide layer 12 enriched with silicon or SRO (acronym from the English "Silicon Rich Oxide"), i.e., layer having an excess of silicon (Si).

It is in fact known to subject such a SRO layer 12, deposited through chemical deposition from vapor phase assisted by plasma or PECVD (acronym from the English "Plasma Enhanced Chemical Vapor Deposition"), to annealing processes with the subsequent precipitation of silicon nanocrystals 12A due to the excess of silicon present in the silicon oxide layer 12.

When the sizes of these nanocrystals 12A are smaller than about 4 nm, the relative band electronic structure is modified with respect to that of a silicon crystal. In particular, the confinement quantum effects produce a widening of the gap of the SRO silicon layer 12 with the effect of facilitating the radiative electronic transitions with light emission (Light) within the visible field, obtaining in this way the silicon luminous LED 10.

It is thus possible to realize, by using the common techniques used in the field of the microelectronics, a luminous source 19 integrated in silicon, as schematically shown in FIG. 3B. In particular, above at least one portion of the SRO layer 12 a polysilicon layer 13 is realized and, above the integrated structure thus obtained, a further silicon oxide layer 14 is deposited.

Suitable openings are then realized in the integrated structure thus obtained, in particular a first opening 15A in a first portion devoid of the polysilicon layer 13, with elimination of the silicon oxide layer 14 and of the underlying SRO layer 12, and a second opening 15B in a second portion in correspondence with the polysilicon layer 13, with elimination of the silicon oxide layer 14, of the polysilicon layer 13 and of the SRO layer 12.

In correspondence with these openings 15A and 15B respective first and second contact structures, 16A and 16B are finally realized in metallic material.

In this way, in a portion 14A of the silicon oxide layer 14 above the polysilicon layer 13 and of the SRO layer 12 and free from the second contact structure 16B, there is light emission (indicated with L in FIG. 3B).

A first plan view of such a luminous source 19 integrated in silicon is schematically shown in FIG. 3C.

It is also known to remedy the problem of the inefficiency of the silicon to emit light in an efficient way by doping a silicon oxide layer (SiO2) with ions of rare earths (Erbium but also Terbium and Cerium) for obtaining a luminous source or LED in silicon.

In fact, the rare earths (usually indicated with RE, Rare Earths) have an optical transition at a characteristic wave length equal to 1.54 µm for the Erbium, which corresponds to the minimum attenuation on silica-based optical fibers, 0.54 µm (in green) for the Terbium and 0.48 µm (in blue) for the Cerium, and, if inserted in a silicon oxide layer, can be efficiently excited through the impact of a charge carrier.

As previously seen, a luminous source such as a silicon LED is associated with a detector or photodetector, which has the task of reconverting the luminous signal emitted by the luminous source into electric pulses.

It is known to realize such a photodetector in the form of a photodiode, i.e., a PN junction whose conductivity increases as a function of the increase of the intensity of the incident light. For further increasing the sensitivity of the photodetector, it is also known to resort to more complex structures, in particular to phototransistors or photodarlington. Moreover, for supplying loads in network voltage alternated current, it is known to use the so called phototriac devices, whose trigger always occurs by lighting the device itself.

The structure more commonly used for realizing a photodetector is that of a phototransistor, essentially comprising a normal bipolar transistor NPN whose base-collector junction, inversely biased, is exposed to luminous radiation. In this way, the incident light generates pairs electron-gap in the emptying region between base and collector of the bipolar transistor, thus producing a photocurrent, which behaves exactly as a base current $I_B$ of a normal bipolar transistor (in this case, the bipolar transistor used as a phototransistor has a base transistor kept floating and thus a void real base current $I_B$). This photocurrent is then amplified by a factor equal to the inner gain of the bipolar transistor due to the well known transistor effect.

A galvanic optocoupler of the integrated type and comprising a photodetector in the form of a photodiode in amorphous silicon deposited on a luminous source having an active means constituted by a silicon oxide layer (SiO2) implanted with Germanium ions (Ge+), responsible for the luminescence, as well as a galvanic insulation layer realized by a thick silicon oxide layer are described for example in European patent application No. EP 1132975.

The integrated structure proposed in this document for realizing the galvanic optocoupler also uses a thin indium oxide layer, known as ITO (acronym from the English "Indium Tin Oxide") for realizing the contacts of the light source, material typically more expensive than the polysilicon normally used in the circuits integrated in the microelectronics.

The technical problem underlying the present disclosure is that of devising a galvanic optocoupler suitable for being monolithically integrated by using integration techniques and processes currently in use in microelectronics and having such structural and functional characteristics as to overcome the limits and drawbacks still affecting the galvanic optocouplers realized according to prior designs.

BRIEF SUMMARY

The present disclosure provides a galvanic optocoupler having a phototransistor as a photodetector, a final passivation layer of the phototransistor serving as a galvanic insulation layer suitable for interfacing and separating the photodetector from the luminous source.

On the basis of this disclosure, the technical problem is solved by a galvanic optocoupler as previously indicated and having at least one luminous source and a photodetector interfaced by a galvanic insulation layer wherein the photodetector is a phototransistor formed on the silicon substrate and the galvanic insulation layer is a passivation layer of the phototransistor.

In a preferred embodiment of the galvanic optocoupler according to the disclosure, the luminous source includes an integrated LED having a first polysilicon layer with a function of cathode and a second polysilicon layer with a function of an anode, the first and second layer enclosing at least one light emitter layer, further preferably a silicon oxide layer enriched with silicon (SRO).

Suitably, the galvanic insulation layer is realized in a material having good optical transparency and that is electrically insulating, preferably a passivation layer in BPSG.

The disclosure also provides a process for integrating a galvanic optocoupler as previously integrated and including the steps of:

integrating a photodetector over a silicon substrate;

depositing a galvanic insulation layer above the photodetector; and integrating a luminous source over the galvanic insulation layer, wherein the integration of the photodetector includes providing or forming a phototransistor having a final passivation layer suitable for serving as galvanic insulation layer.

In a preferred embodiment of the integration process of a galvanic optocoupler according to the disclosure, the integration of the phototransistor further includes the steps of:

thermal oxidation with formation of a thick oxide layer above the substrate;

masking and etching of the thick oxide layer;

thermal oxidation with formation of a gate oxide layer; and ionic implantation of a first type of dopant for realizing a body region of the phototransistor, the body region realizing an optically active region of the phototransistor.

Suitably, the integration of the phototransistor further includes the steps of:

first thermal diffusion of the first type of dopant inside the optically active region;

masking and ionic implantation of a second type of dopant for realizing an emitter well of the phototransistor;

second thermal diffusion of the first type of dopant inside the optically active region; and masking and ionic implantation of the first type of dopant for realizing a base well of the phototransistor.

In accordance with another embodiment of the disclosure, an optical device is provided for coupling a first electronic circuit having a first power level and a second electronic circuit having a second power level. The optical device includes a photodetector transistor formed on a silicon substrate; a galvanic insulation layer formed on the photodetector transistor and the substrate, the galvanic insulation layer forming a passivation layer of the photodetector transistor; and a source of illumination formed on top of the galvanic insulation layer in optical communication with the photodetector transistor.

In accordance with aspect of the foregoing embodiment, the galvanic insulation layer is formed of Boron Phosphor Silicon Glass.

In accordance with another aspect of the foregoing embodiment first and second holes are formed through the galvanic insulation layer and a contact structure is formed in each of the first and second holes in electrical contact with an optically active area of the photodetector transistor.

BRIEF DESCRIPTION OF THE SEVERAL VIEWS OF THE DRAWINGS

The characteristics and the advantages of the galvanic optocoupler and of the relative integration process according to the present disclosure will be apparent from the following description of an embodiment thereof given by way of an indicative and non-limiting example with reference to the annexed drawings, wherein.

DETAILED DESCRIPTION

Figure 1:
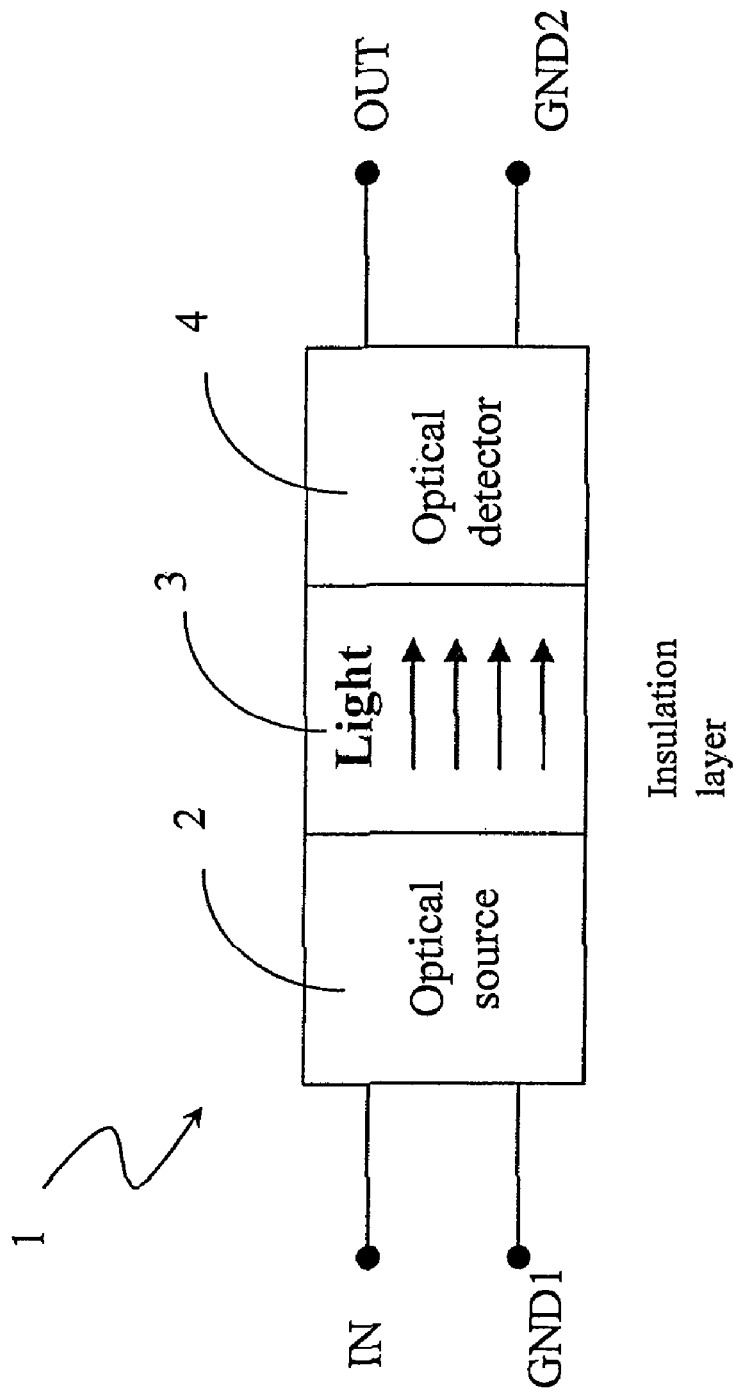
FIG. 1 shows a configuration scheme of a galvanic optocoupler.
Figure 2:
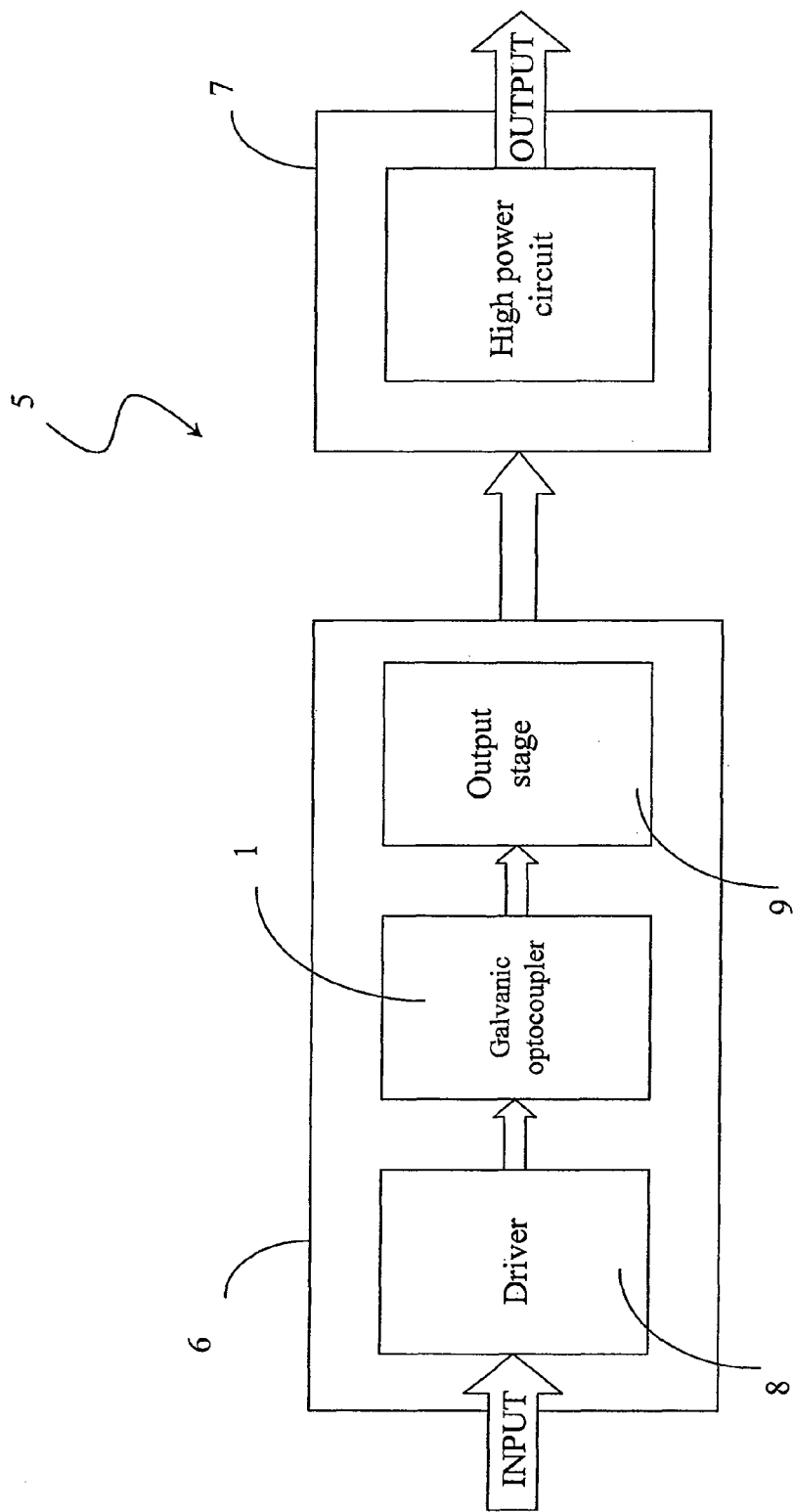
FIG. 2 shows, in greater detail, the scheme of FIG. 1.
Figures 3A, 3B, 3C:
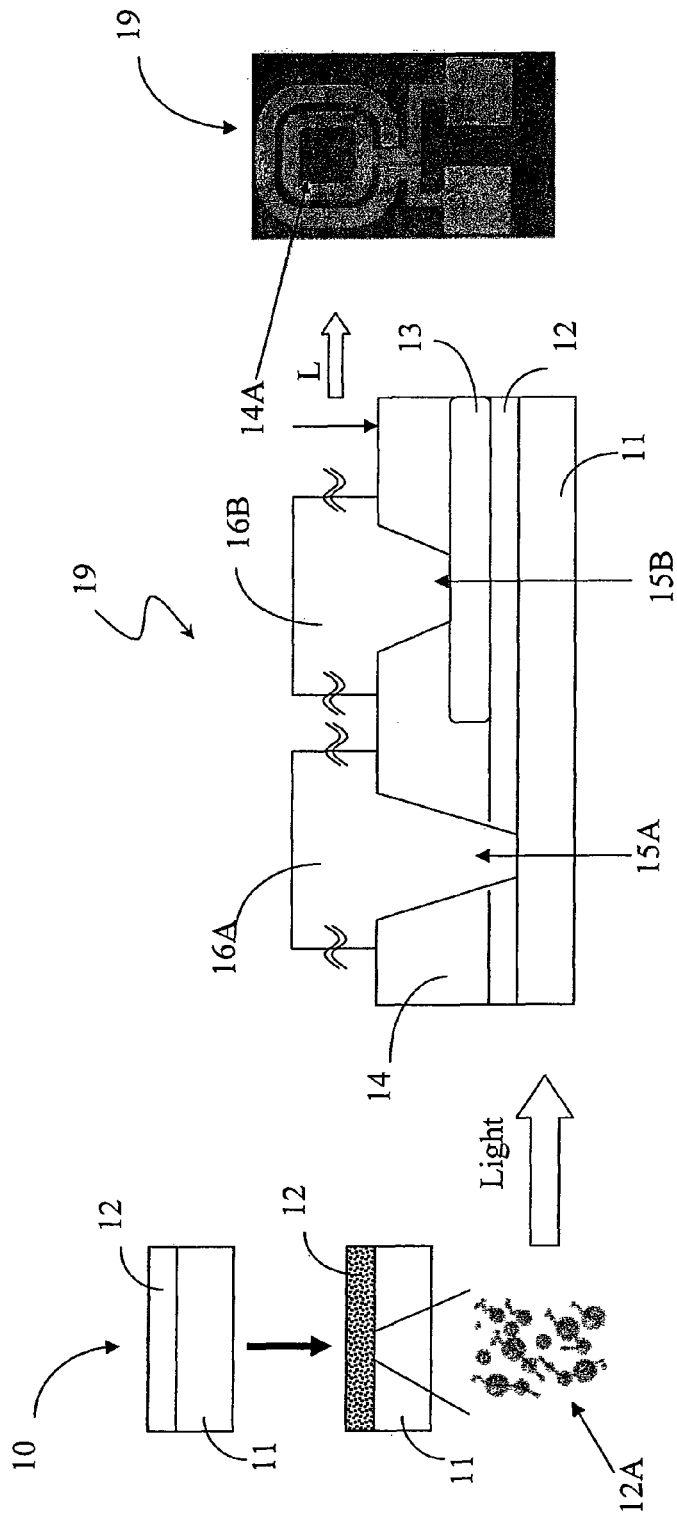
FIGS. 3A-3C schematically show an integrated galvanic optocoupler realized according to the prior art.
Figure 4:
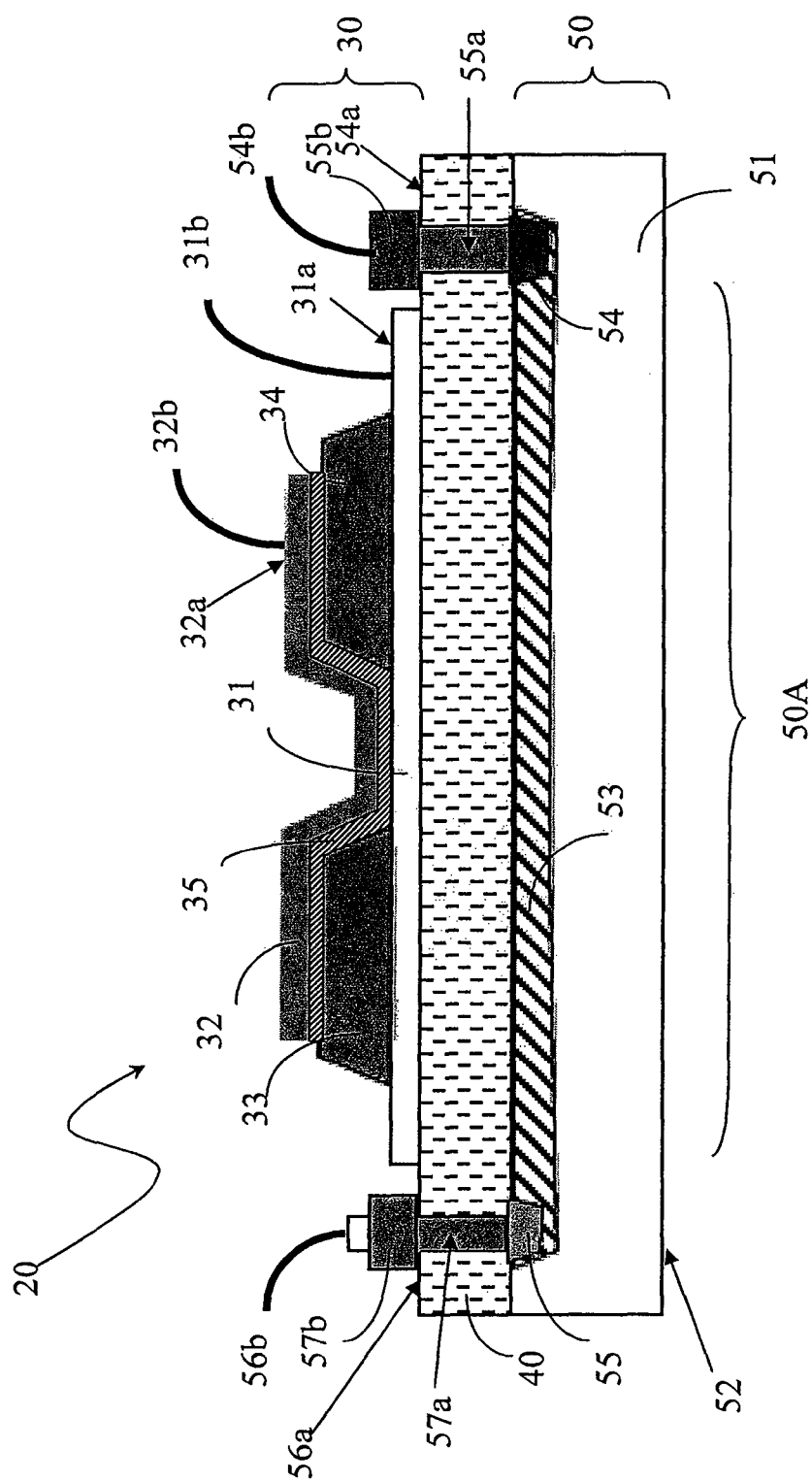
FIG. 4 schematically shows an integrated galvanic optocoupler realized according to the present disclosure.

With reference to these figures, and in particular to FIG. 4, a galvanic optocoupler is schematically shown, globally indicated with reference numeral 20. Essentially, the galvanic optocoupler 20 is monolithically integrated on a silicon substrate and includes an optical source or LED 30 and a photodetector 50 interfaced by means of a galvanic insulation layer 40.

Advantageously according to the disclosure, the galvanic insulation layer 40 is realized by means of a BPSG layer (acronym from the English: "Boron Phosphor Silicon Glass"). It is suitable to note that this BPSG layer is a passivation layer commonly used in the integration of electronic devices.

Further advantageously according to the disclosure, the photodetector 50 is a phototransistor. More in detail, the photodetector 50 is realized on a silicon substrate 51 having at least one lower surface 52 of retro-contact. In the substrate 51 an optically active region 53 is formed, in particular for the generation of a photocurrent, i.e., of a current signal in correspondence with the receipt, by means of the galvanic insulation layer 40 of a luminous signal generated by the LED 30.

In the optically active region 53 a first and a second well are further realized, in particular a base well 54 and an emitter well 56 of the photodetector 50. In particular the base well 54 is a well implanted with boron, while the emitter well 56 is a well implanted with arsenic.

In this way, advantageously according to the disclosure, the photodetector 50 is realized in the form of a phototransistor, in particular a bipolar transistor having an optically active region 53 in correspondence with the LED 30 as well as base and emitter regions corresponding to the base well 54 and to the emitter well 56 that can be contacted through wire bonding and, as it will be hereafter clarified, obtained with the process sequences of the BCD3s type.

Above the photodetector 50, in particular above the optically active region 53 and the base and emitter wells, 54 and 56, the galvanic insulation layer 40 is deposited, above which the LED 30 is realized. The insulation layer 40 is thus formed on both the photodetector 50 and the substrate 51.

In particular, the LED 30 comprises a first polysilicon layer 31 with the function of a cathode and a second layer 32 always of polysilicon with the function of an anode 32, these layers enclosing at least one light emitter layer 35. Advantageously according to the disclosure, this light emitter layer 35 is a silicon oxide layer enriched with silicon or SRO.

Above the cathode 31 an insulation layer of the LED 30 is deposited, in particular silicon oxide, suitably shaped so as to realize at least one first lateral insulation portion 33 and one second lateral insulation portion 34. Ideally, this insulation layer is VAPOX, i.e., silicon oxide deposited in vapor phase.

Suitably, the lateral insulation portions 33, 34 are shaped so as to leave at least one contact portion 31a of the cathode 31 free, in particular for contact by means of a bonding wire 31b.

Similarly, on the anode 32 there is at least one contact portion 32a for contact by means of a respective bonding wire 32b.

Further, the LED 30, in particular its cathode 31, is suitably shaped so as to leave at least one first and one second contact area 54a, 56a free for the base and emitter wells, 54 and 56. In this way, the LED 30 is positioned in correspondence with a useful area 50A of the photodetector 50.

In the galvanic insulation layer 40, in correspondence with this first and second contact area, 54a and 56a, at least one first and one second hole, 55a and 57a, are then realized for the contact of the base and emitter wells, 54 and 55, respectively.

In particular, a suitable material is used for the filling of these holes 55a and 57a and the forming of at least one first and one second contact structure of a base 55b and an emitter 57b in turn contacted by means of respective bonding wires 54b, 56b. In a preferred embodiment, this filling material is metallic alloy (AlSiCu).

The galvanic optocoupler is preferably formed from by a block obtained through the monolithical integration of the light source or LED 30 directly on the photodetector 50 in the widely consolidated technology BCD3s.

The present disclosure also provides an integration process for making a galvanic optocoupler 20 in BCD3s technology, which includes the steps of:
  integration on a silicon substrate 51 of a photodetector 50;
  deposition of a galvanic insulation layer 40 above this photodetector 50; and
  integration above the galvanic insulation layer 40 of a luminous source or LED 30.

The integration step of the photodetector 50 realizes a phototransistor having at least one optically active region 53 in correspondence with the LED 30 as well as a base well 54 and an emitter well 56 that can be contacted through wire bonding. More in detail, the integration step of the photodetector 50 in the form of a phototransistor 50 on an epitaxial silicon substrate 51, in the example shown of a first type of dopant, in particular of the P type, includes the following steps of:
  thermal oxidation with formation of a thick oxide layer above the substrate 51;
  masking and etching of the thick oxide layer;
  thermal oxidation with formation of a gate oxide layer;
  p type ionic implantation for realizing a body region of the phototransistor 50, this body region being the optically active region 53 first thermal diffusion of the dopant of the p type inside the optically active region 53;
  masking and ionic implantation of a second type of dopant, in particular of the n type, for realizing the emitter well 56;
  second thermal diffusion of the dopant of the p type inside the optically active region 53; and
  masking and ionic implantation of the p type for realizing the base well 54.

It is to be noted that after having deposited the process layers that form the phototransistor 50, a passivation layer is further deposited, in particular a BPSG layer, used in the galvanic optocoupler 20 as a galvanic insulation layer 40.

The integration process according to the present disclosure then goes on with the integration of the LED 30, above this galvanic insulation layer 40 by means of the further steps of:
  deposition on the galvanic insulation layer 40 of a first polysilicon layer for to form the cathode 31 of the LED 30; and
  masking of this first polysilicon layer and successive etching for the shaping of the cathode 31;
  deposition of a thick oxide (VAPOX) and etching of this oxide layer to form a first electrical lateral insulation portion 33 and a second electrical lateral insulation portion 34 of the LED 30;
  deposition, above the cathode 31 of an enriched silicon oxide layer or SRO that functions as the light emitter layer 35;
  deposition of a second polysilicon layer above the SRO layer; and
  masking and etching of the SRO layer and of the second polysilicon layer to form the anode 32.

In substance, the present disclosure proposes a monolithically integrated galvanic optocoupler of the type having at least one light source or LED 30 and one photodetector 50 in the form of a phototransistor, successfully monolithically integrating photonic functions on silicon. In particular, the photodetector 50 is in the form of a silicon NPN phototransistor deposited below the light source (while, in the known solutions an amorphous silicon photodiode is deposited above the source itself).

The phototransistor 50 includes at least one optically active region 53 in correspondence with the LED 30 as well as a base well 54 and an emitter well 56 that can be contacted through wire bonding due to the presence of the contact structures 55b, 57b formed of the metallic alloy AlSiCu. Moreover, the electrodes 31, 32 of the LED 30 have been formed in the polysilicon, eliminating the need for using the Indium Thin Oxide (ITO), as in the devices currently on sale. Oxide is typically much more expensive than polysilicon.

Further, the LED 30 is configured to emit light through the galvanic insulation layer 40 and to directly interface with the photodetector 50.

It is thus important that this galvanic insulation layer 40 have a good optical transparency and is electrically insulating as it normally occurs for the passivation layer BPSG used for the transistors realized in BCD3s technology.

The LED 30 includes a SRO layer that functions as the light emitter layer. In this respect, it is to be underlined that the presence of silicon nanocrystals in a silicon oxide matrix, obtained through annealing processes on an oxide SRO layer rich in silicon facilitates the radiative electronic transitions in the silicon with the emission of visible light.

Moreover, the LED 30 and the photodetector 50 are suitably sized so that:
  1. The light emitted by the light emitter layer 35 of the LED 30, after passage through the galvanic insulation layer 40 ends inside the useful area 50A of the photodetector 50;
  2. A space for the electric contacting of the photodetector 50 (in particular the contact portions 54a, 56b) is reserved through suitable shaping of the LED 30, in particular of its cathode 31;
  3. The cathode 31 and anode 32 of the LED 30 can be directly, electrically contacted by means of respective bonding metallic wires (31b, 32b), due to the presence of further reserved spaces, i.e., the contact regions 31a, 32a on the exposed side of the LED 30. In this way the correct operation of the galvanic optocoupler 20 according to the disclosure is ensured.

The present disclosure thus provides an optoelectronic device, in particular a galvanic optocoupler based on silicon and realized by using a consolidated microelectronic integration technology, in particular the BCD3s technology, providing new perspectives for the traditional optoelectronics market.

The present disclosure provides for completely new application classes (biomedical, sensors, etc.), as well as the possibility of using the galvanic optocoupler for the realization of more sophisticated and complete structures, and in a particular way advantageous in the field of the so called "system solutions".

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not to be limited by the disclosure.

The invention claimed is:

1. A galvanic optocoupler monolithically integrated on a silicon substrate, and comprising: at least one luminous source device and a photodetector interfaced by a galvanic insulation layer formed of an electrically insulating material having optical transparency, wherein said photodetector comprises a phototransistor formed on said silicon substrate and wherein said galvanic insulation layer is a passivation layer of said phototransistor and the at least one luminous source device is formed on the galvanic insulation layer.

2. The galvanic optocoupler of claim 1, wherein said luminous source is formed above said galvanic insulation layer and includes an integrated light emitting diode (LED) having a first polysilicon layer structured as a cathode and formed on the galvanic insulation layer, and a second polysilicon layer configured as an anode, said first and second polysilicon layers enclosing at least one light emitter layer.

3. The galvanic optocoupler of claim 2, wherein said light emitter layer comprises a silicon oxide layer enriched with silicon (SRO).

4. The galvanic optocoupler of claim 3, wherein said galvanic insulation layer comprises a passivation layer formed of Boron Phosphor Silicon Glass (BPSG).

5. The galvanic optocoupler of claim 4, wherein said photodetector comprises at least one optically active region for the generation of a photocurrent when receiving a luminous signal generated by said luminous source.

6. The galvanic optocoupler of claim 5, wherein said photodetector further comprises at least one first well and one second well formed in said optically active region and configured to form a base contact region and an emitter region of said phototransistor, respectively.

7. The galvanic optocoupler of claim 6, wherein said galvanic insulation layer comprises at least one first hole and one second hole for the contact of said base and emitter wells, respectively.

8. The galvanic optocoupler of claim 7, wherein said photodetector further comprises at least one first contact structure and one second contact structure of said base and emitter wells realized through filling of said first hole and second hole and contacted by means of respective bonding wires.

9. The galvanic optocoupler of claim 8, wherein said first contact structure and second contact structure are formed of an ametallic alloy (AlSiCu).

10. The galvanic optocoupler of claim 9, wherein said luminous source is positioned in correspondence with a useful area of said photodetector.

11. The galvanic optocoupler of claim 10, wherein said luminous source is suitably shaped so as to leave at least one first contact area and one second contact area free in correspondence with said first and second contact structures of said base and emitter wells of said photodetector.

12. The galvanic optocoupler of claim 11, wherein said luminous source further comprises respective contact portions for said cathode and anode suitable for being contacted by means of respective bonding wires.

13. The galvanic optocoupler of claim 12, wherein said luminous source further comprises an insulation layer suitably shaped so as to realize at least one first and one second electric lateral insulation portions of said luminous source above said cathode.

14. The galvanic optocoupler of claim 13, wherein said insulation layer is silicon oxide deposited in vapor phase (VAPDX).

15. An integration process of a galvanic optocoupler of the type monolithically integrated and having at least one luminous source and one photodetector interfaced by means of a galvanic insulation layer, comprising:
    integrating a photodetector on a silicon substrate;
    depositing a galvanic insulation layer over said photodetector; and
    integrating a luminous source device on the galvanic insulation layer,
    wherein said integration step of said photodetector realizes a phototransistor having the galvanic insulation layer as a final passivation layer.

16. The integration process of claim 15, wherein said integration step of said phototransistor further comprises:
    thermal oxidation with formation of a thick oxide layer above said substrate;
    masking and etching of said thick oxide layer;
    thermal oxidation with formation of a gate oxide layer; and
    ionic implantation of a first type of dopant for realizing a body region of said phototransistor, said body region realizing an optically active region of said phototransistor.

17. The integration process of claim 16, wherein said integration step of said phototransistor further comprises:
    first thermal diffusion of said first type of dopant inside said optically active region;
    masking and ionic implantation of a second type of dopant for realizing an emitter well of said phototransistor;
    second thermal diffusion of said first type of dopant inside said optically active region; and
    masking and ionic implantation of said first type of dopant for realizing a base well of said phototransistor.

18. The integration process of claim 17, wherein depositing comprises depositing of a passivation layer of said phototransistor.

19. The integration process of claim 17, wherein depositing a galvanic insulation layer comprises depositing a BPSG layer.

20. The integration process of claim 18, wherein integrating of said luminous source further comprises:
    depositing on said galvanic insulation layer a first polysilicon layer for realizing a cathode of said luminous source;
    masking of said first polysilicon layer and successive etching for the shaping of said cathode;

deposition of a thick oxide (VAPDX) and etching of said oxide layer for the realization of a first and a second electric lateral insulation portion of said luminous source; and depositing an enriched silicon oxide layer (SRO) over said cathode with function of light emitter layer of said luminous source.

21. The integration process according to claim 20, wherein integrating of said luminous source further comprises:

depositing a second polysilicon layer over said enriched silicon oxide layer (SRO); and masking and etching of said enriched silicon oxide layer (SRO) and of said second polysilicon layer for the realization of an anode of said luminous source.

22. A device, comprising:

a photodetector transistor formed on a silicon substrate;

a galvanic insulation layer formed on the photodetector transistor and the substrate, the galvanic insulation layer forming a passivation layer of the photodetector transistor; and a source of illumination formed on top of the galvanic insulation layer in optical communication with the photodetector transistor through the galvanic insulation layer.

23. The device of claim 22, wherein the galvanic insulation layer is formed of Boron Phosphor Silicon Glass.

24. The device of claim 22, comprising first and second holes formed through the galvanic insulation layer and a contact structure formed in each of the first and second holes in electrical contact with an optically active area of the photodetector transistor.

* * * * *

UNITED STATES PATENT AND TRADEMARK OFFICE
CERTIFICATE OF CORRECTION

PATENT NO. : 8,097,868 B2  
APPLICATION NO. : 12/019186  
DATED : January 17, 2012  
INVENTOR(S) : Mariantonietta Monaco et al.

It is certified that error appears in the above-identified patent and that said Letters Patent is hereby corrected as shown below:

Column 10, Line 21:
"(VAPDX)." should read, --(VAPOX).--.

Column 11, Line 1:
"deposition of a thick oxide (VAPDX) and etching of said" should read, --deposition of a thick oxide (VAPOX) and etching of said--.

Signed and Sealed this
Sixth Day of March, 2012

David J. Kappos
*Director of the United States Patent and Trademark Office*